United States Patent [19]
van den Berg et al.

[11] Patent Number: 5,580,509
[45] Date of Patent: Dec. 3, 1996

[54] METHOD FOR ELECTRICALLY CONTACTING THIN-FILM SOLAR MODULES

[75] Inventors: Robert van den Berg; Hans-Juergen Bauer, both of Munich, Germany

[73] Assignee: Siemens Solar GmbH, Munich, Germany

[21] Appl. No.: 345,586

[22] Filed: Nov. 28, 1994

[30] Foreign Application Priority Data

Nov. 26, 1993 [DE] Germany ............ 43 40 402.2

[51] Int. Cl.⁶ .............. B29C 63/02; B29C 65/02; B32B 31/04; H01L 31/048
[52] U.S. Cl. .......... 264/272.15; 136/251; 156/309.6; 264/272.17
[58] Field of Search ............ 156/309.6; 136/244, 136/251; 264/272.17, 272.15, 272.11

[56] References Cited

U.S. PATENT DOCUMENTS

| | | | |
|---|---|---|---|
| 4,773,944 | 9/1988 | Nath et al. ............... | 136/251 X |
| 5,125,984 | 6/1992 | Kruehler et al. ......... | 136/255 |
| 5,131,954 | 7/1992 | Vogeli et al. ............ | 136/244 |
| 5,137,835 | 8/1992 | Karg ....................... | 136/265 X |
| 5,252,139 | 10/1993 | Schmitt et al. . | |

*Primary Examiner*—Adrienne C. Johnstone
*Attorney, Agent, or Firm*—Hill, Steadman & Simpson

[57] ABSTRACT

In a method for electrically contacting thin-film solar modules interconnected in integrated fashion, a number of solar cells forming a module are created by structuring a layer on a substrate to produce strip-shaped, side-by-side solar cells, and electrically conductive contact strips are laid over the electrode layers of the two outermost, individual solar cells. The conductive strips are held in place by a lamination using hot-melt adhesive foil at elevated pressure and temperature, in the same step wherein a backing is laminated with the solar module. If necessary, the contact strips can be attached by an electrically conductive paste or utilizing an ultrasonic welding process.

16 Claims, 1 Drawing Sheet

METHOD FOR ELECTRICALLY CONTACTING THIN-FILM SOLAR MODULES

BACKGROUND OF THE INVENTION

1. Field of the Invention

The present invention is directed to a method for electrically contacting thin-film solar modules, and in particular to such a method for electrically contacting thin-film solar modules comprised of a plurality of side-by-side, strip-shaped solar cells.

2. Description of the Prior Art

Thin-film solar modules are usually produced directly on large-area substrates and are structurally integrated. Such modules have two electrode layers, and at least the electrode layer of the thin-film solar module facing toward the light incidence side is usually composed of a thin conductive oxide, particularly when the light must enter through a transparent substrate and a transparent, first electrode layer. Zinc oxide, stannous oxide or fluorine-doped indium tin oxide, for example, can serve as material for such transparent electrode layers. By structuring the thin-film solar modules, strip-shaped individual solar cells are produced which are connected in series to one another. The current which is generated by the incident light is then tapped at the two outermost cells.

Conductive oxides such as, for example, zinc oxide have a relatively small electrical conductivity. In order to maintain the electrical losses due to the increased series resistance low, the current path must be kept as short as possible in the cells. As a consequence, designers of such modules strive for an optimally low structural width in the strip-shaped structuring. The current tap at the two outer strip cells ensues by means of continuous contacting along the entire length of the outer strip cells to the extent possible.

In such known modules composed of amorphous silicon with zinc oxide electrodes, the electrical contacts at the outermost cells were soldered on. A solderable substrate, however, is required for this purpose. To that end, a current busbar is applied on the module substrate before the deposition of electrode layers and the active semiconductor layer. This current busbar permits soldering of a continuous contact strip over the entire cell length of the outermost cells, and also has a higher conductivity than the transparent, conductive oxide employed. The resistance loss is thus kept low even when the contact strip is only spot soldered.

The application of such current busbars usually ensues in a silkscreening process with heatable, conductive silver paste. Certain disadvantages, however, are associate with this known module manufacturing technique. During the heating process of the conductive silver paste, the wafers may be heated beyond the transformation point of the glass, and become pre-stressed due to rapid cooling. This limits this process to one employing pre-stressed wafers. In some circumstances, however, it may be more desirable to employ wafers which are not pre-stressed, in which case this known technique cannot be used. Although it is possible to avoid the pre-stressing by slowly cooling the glass, this is uneconomical because of the longer time required. The printing of the current busbars must ensue on a module edge length of more than one meter with a small tolerance with regard to the parallel alignment between the opposite busbars and relative to the substrate edges, so that the structuring of the module which is undertaken later with, for example, a laser, is not impaired. Since printing of the current busbars ensues at a small distance from the module or from the substrate edge, and since the printing is implemented under pressure, the screen which is employed for the printing is subject to increased wear. Techniques involving printing of a current busbar, therefore, are complicated and uneconomical.

SUMMARY OF THE INVENTION

It is an object of the present invention to provide a method for electrically contacting thin-film solar modules which abandons the complicated printing of a current busbar, is simpler to implement, and which produces an electrical contact with good electrical conductivity that is structurally well-attached to the module.

Another object of the present invention is to provide such a method which does not produce an elevated series resistance.

The above object is achieved in accordance with the principles of the present invention in a method for electrically contacting thin-film solar modules wherein a thin-film solar module is produced on a substrate with solar cells comprising the module being structured to form side-by-side strips which are connected in series, with the strips comprising the module having first and second electrode layers, at least one of which is a transparent, conductive oxide. A contact strip is laid over the second electrode layer along the two outer edges of the substrate parallel to the strip-shaped cells, and a covering is laminated over the entire structure with the assistance of a hot-melt adhesive foil under elevated pressure and elevated temperature.

In the method of the invention, there is no need at all to apply a current busbar to the module substrate. The electrical contacting ensues in a simple way by merely placing contact strips onto the two, outermost cells of the structured thin-film solar module. The subsequent laminating process, wherein a cover film or a cover wafer is laminated onto the structure, results in a reliable mechanical fixing of the two contact strips over the outer solar cells. At the same time, the contact strips are pressed so firmly onto the second electrode layer that a good electrical contact therewith is produced.

Substantially no additional tools or machines, therefore, are required for contacting the thin-film solar module in accordance with the method of the invention. Both pre-stressed glass wafers, which have increased mechanical stability for a given thickness, or wafers which are not pre-stressed, and which can therefore be cut and thus enable greater product flexibility, can be employed as the substrate. The soldering of the contact strip, as has heretofore been standard, can also be eliminated so that the inventive method is further simplified in comparison to known methods. The risk of inhomogeneities in the layer and an associated negative influence on the performance of the solar module also was present in the deposition of the layers over the current busbar applied on the substrate in known methods. As in the known methods, the contacting of the two outermost strip solar cells ensues from above, and as also in the known methods, this renders one of the two outermost solar cells as being unable to provide a current contribution to the overall module output, since one of those two outermost cells will not have sufficient dual contacting to generate charge. In the inventive method, however, it is possible to displace the inner edge of this outer, useless individual cell so as to be closed to the contact strip, and thus closer to the outer module edge formed by the opposite edge of that outermost cell than was possible to achieve with a printed current busbar. The inactive area required for this individual, useless cell can there be minimized, with a consequent increase in the active module area.

The contact strip can be manufactured of any suitable material having good electrical conductivity, and is preferably a flat metal strip of the type already known for use as a contact strip. In the selection of materials, it must merely be observed that a good ohmic contact to the material of the second electrode layer is produced, and that this contact does not cause corrosion or diffusion by virtue of the two materials being too dissimilar.

In a further embodiment of the invention an electrically conductive paste can be applied beneath the contact strip, at least in punctiform fashion. This improves the electrical contacting, and, given the use of a suitable paste, the contact strip can be fixed on the thin-film solar module before the laminating. Continuous application of the paste, however, may be preferred for producing a contact for solar modules having, for example, a flexible cover film which would not produce sufficient pressing force through the backside. Such conductive pastes or adhesive usually contain highly conductive metal particles, lampblack or graphite.

In another embodiment of the invention, the contact strip is soldered directly on the second electrode layer by ultrasound welding before the laminating. This can ensue in a punctiform fashion at only a few locations, and thus permits the contact strip to be positioned in an exact manner on the solar module when the covering is laminated on. Such ultrasonic welding may alternatively be undertaken continuously, so that a good electrical contacting is still possible even in the case of solar modules of the type described above wherein a sufficient pressing force through the backside is not present. Slippage of the contact strip during laminating, and a short to a neighboring cell as a result, are thus avoided.

DESCRIPTION OF THE PREFERRED EMBODIMENTS

Figure 1:
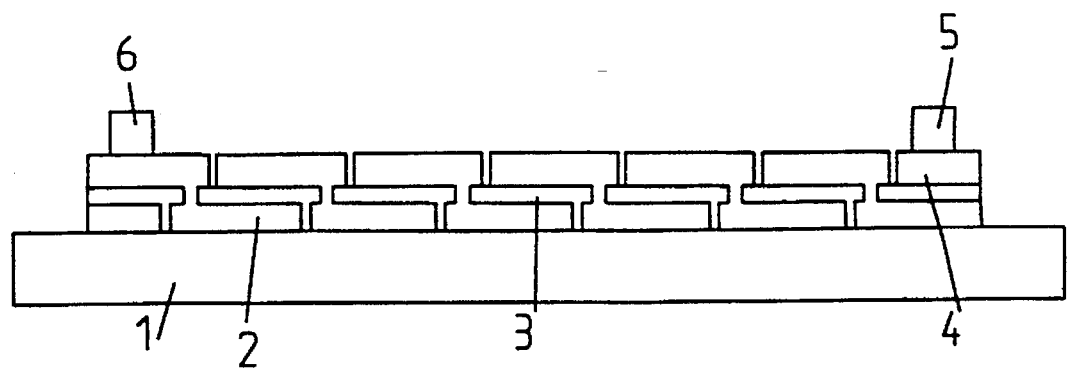
FIG. 1 is a side view of a thin-film solar module manufactured in accordance with the principles of the present method, prior to lamination.

FIG. 1 shows a thin-film solar module interconnected in integrated fashion which is produced in a known manner on a large-area substrate 1. For example, a pre-stressed glass wafer of soda-lime glass which is 2 mm thick is employed as the substrate 1. A front electrode 2 may be composed of zinc oxide approximately 1 μm thick and can be doped with aluminum or boron. The active semiconductor layer 3 is composed of amorphous silicon (a-Si:H) and is applied, for example, with a thickness of 300 nm. Layers of different conductivity type, forming at least one pn-junction, for example a p-i-n structure, are produced by admixing dopant gases to the deposition atmosphere during the plasma deposition process. The back electrode 4 is applied over the semiconductor layer 3. The back electrode 4 is also preferably composed of thin, conductive oxide, such as zinc oxide, and has a thickness of approximately 2 μm.

For the integrated interconnection of the thin-film solar module, each deposition process for the individual layers 2, 3 and 4 is followed by a structuring step. The structuring lines are oriented so that a plurality of side-by-side stripshaped individual solar cells, connected in series, are produced with corresponding overlapping regions between the front and back. The current generated in the thin-film solar module can be tapped and conducted away from the module by contacting the two outermost, strip-shaped, individual solar cells. To that end, two contact strips 5 and 6 are laid directly on the back contact of the two outermost, stripshaped, individual solar cells, parallel to the structuring lines. The contact strips 5 and 6 can consist of any suitable metal, for example, a tin-plated copper strip, having a width of 2.5 mm.

Figure 2:
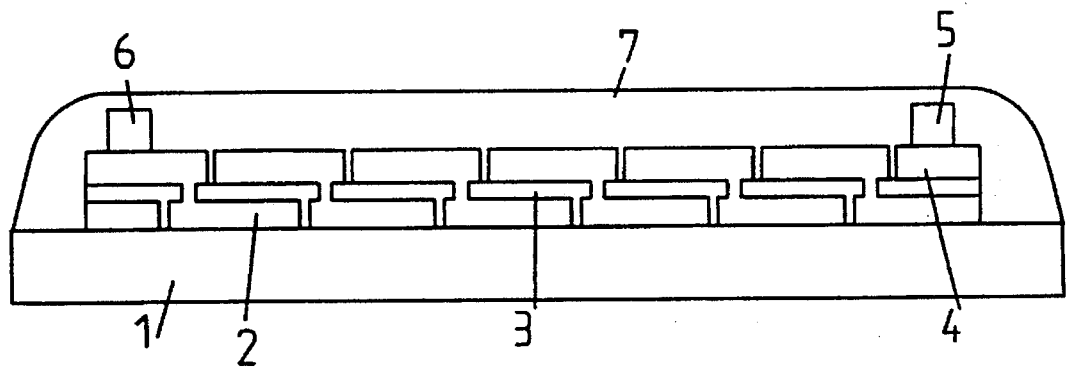
FIG. 2 is a side view of a thin-film solar module manufactured in accordance with the present method, after lamination.

FIG. 2 shows how the contact strips 5 and 6 are mechanically fixed when the backside covering is laminated on. In the simplest embodiment of the invention, the backside covering is composed of a hot-melt adhesive foil, for example polyvinyl butyral. It is also possible to laminate a further film or foil, for example a Tedlar film onto the structure using the hot-melt adhesive foil 7, this further foil or film having adequate mechanical strength and assuring reliable protection of the thin-film solar module from different climatic conditions. It is also possible to laminate a thin glass wafer onto the structure as a backside covering using the hot-melt adhesive foil 7. If the contact strips 5 and 6 are, prior to lamination, held in place by an electrically conductive paste or using ultrasonic welding, a backside can be employed which does not exert any pressing force onto the contact strips 5 and 6, for example organic or inorganic protective lacquerings or coatings.

The laminating ensues by placing the hot-melt adhesive foil onto the thin-film solar module, with the contact strips 5 and 6 placed thereon in conformity with FIG. 1. By avoiding any relative horizontal motion between the unmelted (solid) hot-melt adhesive foil as it is being placed over the solar module, it is assured that the contact strips 5 and 6 will not slip on the module during the laminating process. In order to conduct the laminating itself, the entire device is heated under pressure, until the hot-melt adhesive foil softens and sticks to the thin-film solar module. A tight sealing of the entire module structure is simultaneously achieved.

The pressure exerted on the module during the laminating ensures that a good ohmic contact is produced between the strips 5 and 6 and the back electrode layer 4. Compared to conventionally contacted solar modules, wherein the contact strips were firmly soldered to a current busbar applied on the substrate, the method of the invention produces an electrical contact for the thin-film solar module with consistently good electrical characteristics. An additional mechanical fixing of the contact strips on the back electrode layer is not necessary for this reason, but may be employed to enhance the reliability of the laminating process by ensuring that no slippage of the contact strips 5 and 6 on the module occurs during the laminating process. For example, electrically conductive pastes and adhesives may be used for such mechanical fixing. It is sufficient to undertake the mechanical fixing at two points along each contact strip 5 and 6. It is also possible to directly solder each contact strip 5 and 6 to the back electrode by ultrasound welding. To that end, an ultrasound welding head is briefly placed on the contact strip 5 or 6. It is also sufficient to implement such fixing by ultrasonic welding at only two points for each contact strip.

The completely laminated thin-film solar module can now be provided with a frame in order to enhance both the sealing tightness and the mechanical shock resistance. For this purpose, the thin-film solar module can be extrusioncoated with, for example, a polyurethane frame.

A thin-film solar module having contact strips 5 and 6 electrically contacted in accordance with the principles of the present invention exhibits adequate weathering resistance both to humidity and moisture and to temperature cycling in climatic tests. No modification of the electrical values indicating a degradation of the contact occurs even after a long exposure to temperatures in the range of 60° through 70° C., as can occur during the normal operation of a thin-film solar module.

As can be seen in FIG. 2, the thin-film solar module made in accordance with the principles of the present invention can be produced so that a p-doped or p-conductive region faces toward the light incidence side, and one of the outermost strip solar cells at the anode size has a narrower width than the other strip cells. If the contact strip has a width $b_{ks}$, the one outermost strip cell at the anode side has a width $b_{az}$, and a "normal" strip cell has a width $b_{nz}$, then $b_{ks} \leq b_{az} < b_{nz}$ is valid. This permits the surface area of the outermost strip cell at the anode side, which is useless as a charge generator, to be minimized, consequently permitting the active area of the solar module to be increased.

Lastly, the solar module constructed in accordance with the principles of the present invention may have a chalcopyrite semiconductor as an absorber layer.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for providing an electrical contact for a thin-film solar module, comprising the steps of:

producing a thin-film solar module on a substrate and structuring said solar module to produce a plurality of side-by-side strip-shaped integrated solar cells connected in series, and including first and second electrode layers with at least said second electrode layer comprising a transparent, conductive oxide, said thin film solar module including two outermost cells;

laying respective metallic contact strips over the second electrode layer of said two outermost cells parallel to said strip-shaped cells without attaching said metallic contact strips to said second electrode layer;

laying a hot-melt adhesive foil over said contact strips; and laminating said contact strips with said thin-film solar module by melting said hot-melt adhesive foil under elevated pressure and elevated temperature.

2. A method as claimed in claim 1 comprising the additional step of applying an electrically conductive paste beneath said contact strips to hold said contact strips in place during said laminating.

3. A method as claimed in claim 1 comprising the additional step of applying an electrically conductive adhesive beneath said contact strips to hold said contact strips in place during said laminating.

4. A method as claimed in claim 1 comprising the additional step of ultrasonically welding said contact strips onto said outermost cells to hold said contact strips in place during the laminating.

5. A method as claimed in claim 1 wherein the step of producing a thin-film module comprises producing a thin-film module with said first electrode forming a front, light transmissive electrode and said second electrode forming a back electrode, and wherein the step of laying said respective contact strips over said second electrode layer on said outermost cells comprises laying said contact strips on said back electrode of said thin-film solar module.

6. A method as claimed in claim 5 wherein the step of producing said thin-film solar module includes producing a p-conductive region facing toward a light incidence side of said thin-film solar module, and wherein said thin-film solar module has an outermost strip cell at an anode side, and a remainder of normal strip cells, and wherein said contact strips have a first width, said outermost strip cell at said anode side has a second width, and each of said normal cells has a third width, with said first width being less than or equal to said second width and said second width being less than said third width.

7. A method as claimed in claim 1 comprising the additional step of laminating a glass wafer over said contact strips on said module as a covering during the melting of said hot-melt adhesive foil.

8. A method as claimed in claim 1 wherein the step of producing said thin-film solar module comprises producing a thin-film solar module having an amorphous silicon semiconductor layer connected to said first and second electrode layers and forming said first and second layers of zinc oxide.

9. A method as claimed in claim 1 wherein the step of producing said thin-film solar module comprises producing a thin-film solar module having a semiconductor layer formed of an alloy containing amorphous silicon connected to said first and second electrode layers and forming first and second electrode layers of zinc oxide.

10. A method as claimed in claim 1 wherein the step of producing a thin-film solar module comprises producing a thin-film solar module having a plurality of layers including a chalcopyrite semiconductor as an absorber layer.

11. A method for providing an electrical contact for a thin-film solar module, consisting of the steps of:

producing a thin-film solar module on a substrate and structuring said solar module to produce a plurality of side-by-side strip-shaped integrated solar cells connected in series, and including first and second electrode layers with at least said second electrode layer comprising a transparent, conductive oxide, said thin film solar module including two outermost cells;

laying respective metallic contact strips over the second electrode layer of said two outermost cells parallel to said strip-shaped cells;

laying a hot-melt adhesive foil over said contact strips; and laminating said contact strips with said thin-film solar module by melting said hot-melt adhesive foil under elevated pressure and elevated temperature.

12. A method as claimed in claim 11 wherein the step of producing a thin-film module comprises producing a thin-film module with said first electrode forming a front, light transmissive electrode and said second electrode forming a back electrode, and wherein the step of laying said respective contact strips over said second electrode layer on said outermost cells comprises laying said contact strips on said back electrode of said thin-film solar module.

13. A method as claimed in claim 12 wherein the step of producing said thin-film solar module includes producing a p-conductive region facing toward a light incidence side of said thin-film solar module, and wherein said thin-film solar module has an outermost strip cell at an anode side, and a remainder of normal strip cells, and wherein said contact strips have a first width, said outermost strip cell at said anode side has a second width, and each of said normal cells has a third width, with said first width being less than or equal to said second width and said second width being less than said third width.

14. A method as claimed in claim 11 wherein the step of producing said thin-film solar module comprises producing a thin-film solar module having an amorphous silicon semiconductor layer connected to said first and second electrode layers and forming said first and second layers of zinc oxide.

15. A method as claimed in claim 11 wherein the step of producing said thin-film solar module comprises producing a thin-film solar module having a semiconductor layer formed of an alloy containing amorphous silicon connected to said first and second electrode layers and forming first and second electrode layers of zinc oxide.

16. A method as claimed in claim 11 wherein the step of producing a thin-film solar module comprises producing a thin-film solar module having a plurality of layers including a chalcopyrite semiconductor as an absorber layer.

* * * * *